11-6-73 XR 3,770,529

United States Patent [19]

Anderson

[11] 3,770,529

[45] Nov. 6, 1973

[54] METHOD OF FABRICATING MULTILAYER CIRCUITS

[75] Inventor: Leslie C. Anderson, Poughkeepsie, N.Y.

[73] Assignee: International Business Machines Corporation, Armonk, N.Y.

[22] Filed: Aug. 25, 1970

[21] Appl. No.: 66,776

[52] U.S. Cl. ........................ 156/3, 156/16, 156/89, 156/272, 156/285, 219/121 L, 174/68.5

[51] Int. Cl. ........................ B23k 27/00

[58] Field of Search ........................ 156/89, 272, 380; 174/68.5; 219/121 L, 384; 264/154, 22–23; 117/8, 8.5, 38, 93.3; 330/4.3; 331/94.5

[56] References Cited

UNITED STATES PATENTS

| | | | |
|---|---|---|---|
| 3,364,087 | 1/1968 | Solomon et al. | 156/4 |
| 3,369,101 | 2/1968 | Di Curcio | 219/121 L |
| 3,440,388 | 4/1969 | Ostot et al. | 219/121 L |
| 3,561,110 | 2/1971 | Feulner et al. | 156/89 X |
| 3,562,009 | 2/1971 | Cranston et al. | 117/93.3 X |
| 3,040,213 | 6/1962 | Byer et al. | 174/68.5 X |
| 3,597,578 | 8/1971 | Sullivan et al. | 219/121 L |
| 3,226,527 | 12/1965 | Harding | 219/384 |
| 3,189,978 | 6/1965 | Stetson | 156/89 X |
| 3,423,517 | 1/1969 | Arrhenius | 174/68.5 |

OTHER PUBLICATIONS

"Laser Etching Arrangement" an Article by T.J. Harris and B.P.F. Wu in IBM Technical Disclosure Bulletin, Vol. 10, No. 1, June 1967, page 63.

*Primary Examiner*—George F. Lesmes
*Assistant Examiner*—Henry F. Epstein
*Attorney*—Hanifin and Jancin and John F. Osterndorf

[57] ABSTRACT

Multiple level ceramic circuit structures are formed after the individual ceramic "green" sheets are machined using beams of radiation. Vias and channels are formed simultaneously in the individual "green" sheets by exposure of the sheet through a mask having apertures with predetermined dimensions. The method of fabricating the vias and channels recognizes the relationship between the size of the mask aperture and the depth of the machining in the "green" sheet by the beam of radiation. After stacking, registering and laminating the "green" sheets, they are sintered to a unitized state and only then metallized.

5 Claims, 7 Drawing Figures

INVENTOR
LESLIE C. ANDERSON
ATTORNEY

METHOD OF FABRICATING MULTILAYER CIRCUITS

BACKGROUND OF THE INVENTION

1. Field of the Invention

This invention relates to multilayer circuits and, more particularly, to a method of fabricating multilayer ceramic circuits.

2. Description of the Prior Art

The advantages of multilayer circuit boards are well known in the art. As a result of the high packaging densities obtained with them, they have been widely adopted in the electronics industry for the packaging of semiconductor integrated devices. One such package and its method of fabrication are described in co-pending application Ser. No. 850,324 filed Aug. 6, 1969 as a continuation of now abandoned application Ser. No. 538,770 in the names of Ahn, et al. and assigned to the assignee of this invention.

In the method described in that application, ceramic "green" sheets are prepared and communicating feed-through holes are mechanically punched through them. A metallizing paste is prepared and screened on the sheets and in the holes in a desired circuit pattern. After laminating the registered and stacked "green" sheets into an integral whole with the circuit patterns buried in them, they are sintered to burn off the binder material in the sheets and to densify the sheets. The metallizing paste forms porous capillaries communicating within the unitized whole which are subsequently filled with a conductive material by capillary flow techniques.

As is readily apparent, the method of that application involves the mechanical forming of the communicating feed-through holes. The size of such holes is limited to about 10 mils in diameter. It is extremely difficult, if not impossible, to machine holes having a diameter smaller than 10 mils. Moreover, the forming of conductive lines or patterns requires the use of the metallizing paste during the preparation of the prefired ceramic body. Channels cannot be preformed in the "green" sheets for subsequent filling with conductive material. The use of the metallizing paste during this portion of the process adds to the tolerance conditions involved in the fabrication of the package. Registration of the plural "green" sheets in the package is made more difficult. Additionally, because of the temperature relationships existing between the metallizing paste and the ceramic, tighter control must be exercised over the ceramic sintering conditions.

Although machining of various types of bodies including ceramics with beams of radiation such as laser beams has been suggested in the prior art, these techniques have not been applied to the formation by a beam of radiation of both the channels and vias in such structures which subsequently form the electrical interconnectors of the circuit structure. This is particularly true in accomplishing the simultaneous formation of channels and vias having controlled dimensions.

SUMMARY OF THE INVENTION

As contrasted with the prior art, the method of this invention recognizes a definite relationship between the depth of the machining with a beam of radiation and the size of the aperture in the mask through which the beam is directed. The method of the invention involves the simultaneous machining of feed-through vias and channels in individual "green" sheets through preformed patterns of apertures in a mask.

After formation of the vias and channels in the individual "green" sheets, the sheets are stacked, registered and laminated. Sintering densifys them into a unitized structure for metallizing through the vias and channels by die-casting or capillary techniques after the ceramic structure has been fired.

A feature of the invention is the simultaneous machining by a beam of radiation to form vias and channels in individual ceramic "green" sheets accomplishing the formation of much smaller vias and channels than can be obtained with prior art methods.

Another feature of the invention provides for the metallization of the multilayer circuit package to occur only after the unitized ceramic structure has been formed. As a result, the tolerances of the conductor lines and the layer interconnecting conductors in the package are substantially better.

DESCRIPTION OF THE PREFERRED EMBODIMENTS

Figure 1:
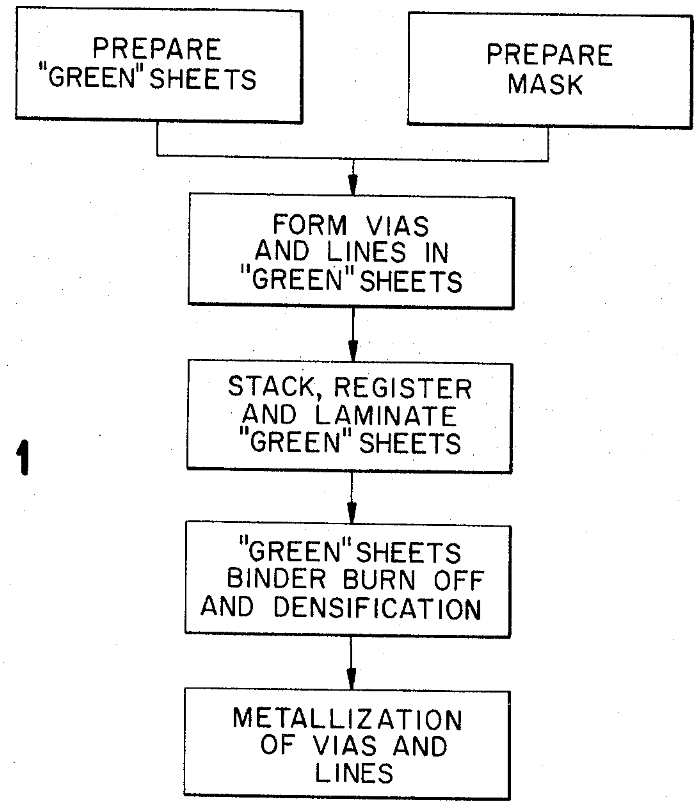
FIG. 1 is a flow chart illustrating the various steps of the method of the invention.

According to the method of this invention, a three-dimensional circuit module wiring scheme is achieved. The method forms all interconnections required in multilayer circuit technology. Referring now to FIG. 1, the process commences with the preparation of ceramic "green" sheets into a form suitable for packaging into a multiple layer structure and subsequent metallization. As is well known in the art, the preparation of a ceramic "green" sheet involves the mixing of a finely divided ceramic particulate and other chemical additives with various organic solders and binders to provide thermoplastic pliant sheets. Until these sheets are sintered to their dense state, they are termed "green sheets."

Many types of ceramic "green" sheets may be employed with this invention. However, in the preferred embodiments, they must specify a certain criteria. As the "green" sheets may be sintered in a reducing atmosphere, the basic constituent oxides contained in the materials of the sheets must not be too easily reduced to the elemental state. Thus, ceramic materials containing lead oxides and titanium oxide are not well suited to this process due to the ease with which the oxides are converted into metallic lead and titanium. As a result, the ceramics containing these metals become either conductive or semiconductive and are thereby rendered useless as insulators in multilayer circuits. Of the many types of ceramics which may be employed, two of the most desirable are the zirconium alkaline earth porcelains (ZAEP) and the aluminas. Other ceramics which may also be used are beryllias, forsterites, steatites, mullites, etc.

An example of forming a ZAEP "green" sheet is as follows: Ceramic raw materials are weighed and mixed in a ball mill. A typical charge for preparing the ZAEP ceramic is:

| | | |
|---|---|---|
| Kaolin | 759 gms | |
| $ZrSiO_4$ | 206 gms | |
| $MgCO_3$ | 86.2 gms | Milling time: 8 hrs. |
| $BaCO_3$ | 201.8 gms | |
| $CaCO_3$ | 99.6 gms | |
| $SrCO_3$ | 150.1 gms | |
| Distilled $H_2O$ | 2500 cc | |

After milling the mixture for eight hours, the slurry is dried, pulverized and calcined at 100° C for one and a half hours. The calcining operation decomposes the carbonates and clay, driving off $CO_2$ and $H_2O$ initiating the chemical reaction process.

Following the calcining operation, the powder is pulverized and micro-milled. The resin, solvents, wetting and plasticizing agents are then mixed with the ZAEP calcined ceramic in a ball mill to make the ceramic organic slurry. From this slurry, the "green" sheets are made normally having a thickness in the range of 6.8 to 7.2 mils and nominally 7.0 mils. A typical batch of slurry is as follows:

| | | |
|---|---|---|
| Polyvinyl Butryl | 36.0 gms | |
| Tergitol | 8.0 gms | |
| DiButyl Pthalate | 12.2 gms | Milling time: 9 hrs. |
| 60/40 Toluene/ Ethanol | 144.0 gms | |
| Cyclohexanone | 121.0 gms | |
| ZAEP Calcine | 400.0 gms | |

In addition to the preparation of the "green" sheets, it is necessary that masks be prepared having desired hole and line patterns in them. As will be apparent from the description which follows hereinafter, the use of the masks with the desired hole and line patterns in them in forming the via holes and channels in the ceramic "green" sheets is one of the features of this invention.

One method of forming the patterns in the masks with accurate hole and line dimensions and without altering other portions of the mask employs materials which respond to the energy from radiation such as an electron beam to form the patterns but are not affected by the radiation directed through the mask in acting on the "green" sheets. One such material which may be used as the mask with formed hole and line patterns is molybdenum. The electron beam is used to heat the mask up and to form accurately holes of desired diameter and lines having predetermined widths. Ordinary photolith masks are also suitable for laser machining. The electron beam may be used in such an operation, but heating of the mask reduces registration accuracy.

As is emphasized in the introductory portion of this specification, one feature of this invention is the recognition of a definite relationship between the size of the various apertures in the mask and the depth of the machining in the "green" sheet by a beam of radiation directed through an aperture. By forming both holes and lines in the mask, the formation of via holes and channels in the ceramic "green" sheets can be performed simultaneously. Dependent on the particular pattern required in a "green" sheet, one or more masks is fabricated.

Figure 2:
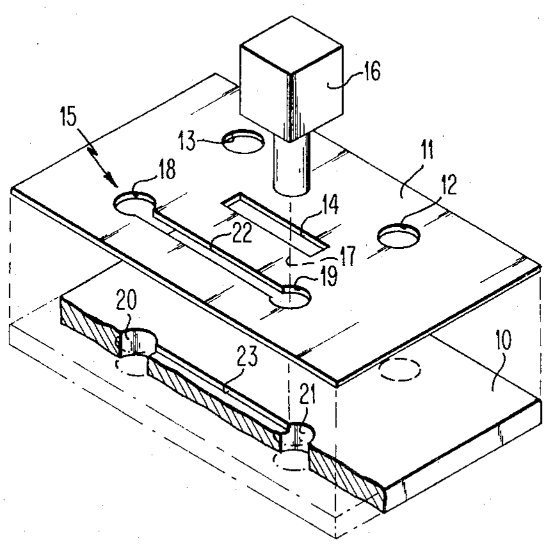
FIG. 2 is an exploded view of a ceramic "green" sheet showing how the vias and channels are formed.

To form the vias and channels simultaneously in the "green" sheets, an apparatus such as shown in FIG. 2 is employed. A single ceramic "green" sheet 10 has a mask 11 positioned over it. The mask is formed with holes 12, 13 and an aperture for a line 14. A combined hole and line arrangement is provided at 15. A source of radiation such as a laser 16 provides a beam 17. The beam 17 from laser 16 may be either a focused beam or operate in a through-mask mode. Preferably, the size of the beam is approximately twice the size of the largest dimension of an aperture in the mask. Typically, the laser may be a carbon dioxide ($CO_2$) laser. Such a laser is reflected from that part of the mask lacking an aperture so that heat is eliminated from the mask. Also, such a laser operates in the infrared region and the organic binder of the "green" sheets absorbs the 10.6 $\mu$ radiation provided by the laser.

As shown in FIG. 2 at the locations in ceramic "green" sheet 10 below a hole 18 or 19, there is provided a via hole 20, 21 directly through the "green" sheet. At the location below the line portion 22 there is a channel 23 partially cut into a "green" sheet.

As has been emphasized, the ceramic "green" sheet material is not sintered or fused by the laser radiation. Rather, the effect occurring on the ceramic material is one of gaseous decomposition of the organic binder. The holes and channels are therefore formed clean and no fusing or phase change exists at the edge of a hole to affect the additional steps required in processing the "green" sheets. The extent of the cut depends on the power level of the laser, the dimensions of the aperture in the mask 11, and the duration of application of the laser power through the aperture in mask 11 to the "green" sheet 10.

As understood, the holes and lines are formed in the "green" sheet 10 due to the heat diffusivity into the "green" sheet. The "green" sheet is volatilized by a relatively low energized laser beam. Some of the heat from the laser beam is dissipated from the bulk of the "green" sheets and the remainder is evaporated away with the volatilized material. The first effect controls the depth of the cut as smaller apertures in the mask permit more heat dissipation to the sides. Less thermal conductance occurs with wide apertures in the mask and therefore more material is volatilized out of the "green" sheets. Some typical examples obtained in forming holes and channels are provided in the table below. Dependent on the particular organic system used for the binder in the ceramic material, the power level of the radiation is in the range of 0.01 to 0.1 joules per 25 square mils of area exposed to the radiation during one millisecond. The particular power level for the laser beam used in acting on the samples in the table below was 40 watts. It was applied for one millisecond per 25 square mils of ceramic "green" sheet area through the apertures in the mask at ceramic "green" sheets having a nominal thickness of 7.0 mils.

TABLE

CHANNELS

Depth of Channel Cut (In Mils)

| Sample Group | Samples | Group Average | Mask Line Width (In Mils) |
|---|---|---|---|
| A | 5.00 | | |
| | 4.84 | | |
| | 4.68 | 4.88 | 3.2 |
| | 4.84 | | |
| | 5.08 | | |
| B | 4.00 | | |
| | 4.30 | 4.10 | 2.8 |
| | 4.00 | | |
| | 4.00 | | |
| C | 3.68 | | |
| | 3.44 | 3.41 | 2.3 |
| | 3.80 | | |
| | 3.32 | | |
| D | 3.20 | | |
| | 3.04 | 3.06 | 2.2 |
| | 2.80 | | |

3.40

HOLES

| Diameter of Mask Hole (in Mils) | Depth of Cut (In Mils) |
|---|---|
| 2.0 | 2.0 |
| 3.0 | 3.5 |
| 4.0 | 5.0 |
| 5.0 | Through — some taper |
| 6.0 | Through — no taper |

Figure 3A:
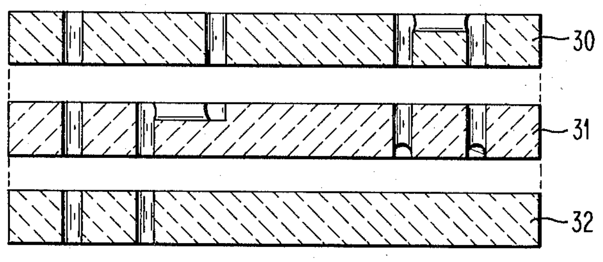
FIGS. 3A–3D are sectional views of the multi-level circuit at various stages during the method of the invention.
Figure 3B:
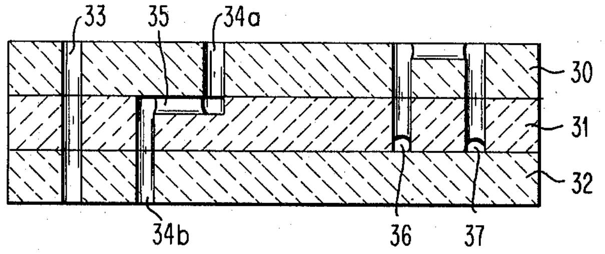

The next step of the process requires that the individual "green" sheets such as 30, 31, 32 in FIG. 3A be stacked and registered. Each of the "green" sheets 30-32 has its own hole and channel personality. When registered together as in FIG. 3B, connection is made where desired among the holes and channels in the "green" sheets. A continuous via hole is provided at 33. A via hole formed at 34a and 34b is connected into a channel connection 35. Provision is also made at 36, 37 for connection into another transverse plane of the registered structure. The registration of the "green" sheets as in FIG. 3B requires that they be placed on a registration platen so that prepunched holes in the "green" sheets register with posts on the platen to assure the proper alignment of the circuit patterns on the various sheets. The platen is then placed in a press at a pressure of 1,000–3,000 lbs. per sq. in. The temperature is then elevated from 40° to 100° C and is held for 3 to 10 minutes. The thermoplastic nature of the "green" sheets causes the various layers to adhere to one another and produce a unitary body as shown in the laminated view of FIG. 3C. In this view, a unitized structure 40 having the hole and channel connections 41, 42, 43 is provided.

After lamination, the structure is allowed to cool to room temperature and is withdrawn from the press. It is then cut or punched to the desired final shape. At the same time, additional through holes may be provided by exposure through a suitable mask. The laminated "green" sheets are then inserted into a sintering oven for burn off of the binder in the "green" sheets and densification of them. The firing process has two phases. The first is binder burn off in an air or reducing atmosphere and the second is densification in a reducing atmosphere. The term "burn off" is meant to thus include oxidation or volatilization of the binder and solvent materials. During binder burn off, the temperature is gradually raised to a temperature level which allows the gradual elimination of the binders and solvents contained within the "green" sheets. Once the binders and solvents have been eliminated, the furnace is permitted to cool to room temperature.

Assuming that a ZAEP "green" sheet having the general formulation given above is used, the burn off schedule may be as follows: The furnace temperature is raised at the rate of 150° per hour to a temperature of 400° C and is kept at 400° C for 3 hours. Then the furnace is permitted to cool at its own rate to room temperature. This gradual burn off allows the binders to be driven off without creating disrupting pressures within the laminate which could cause damage. Once the laminate is balled, it is then ready for the densification or sintering operation. During sintering, the temperature is elevated to a sufficiently high level to densify this ceramic to its final state. This process is carried out in a reducing atmosphere, such as hydrogen. The reducing atmosphere has been found to reduce some of the oxides in certain ceramic materials and for this reason a certain amount of controlled water vapor may be added during this process to prevent this occurrence.

A typical sintering schedule for a ZAEP substrate is as follows: The furnace temperature is raised from room temperature to 1,285° C at rates of 200° C per hour to 800° C per hour and the furnace is maintained at 1,285° C for 3 hours. At the end of the 3 hours, the furnace is then cooled at the same rate at which it was raised in temperature. The burn off and sintering phases may also be accomplished in one continuous heating cycle to eliminate the requirement for cooling at the end of the burn off period.

Figure 3C:
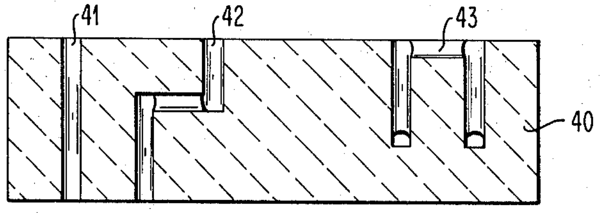
Figure 3D:
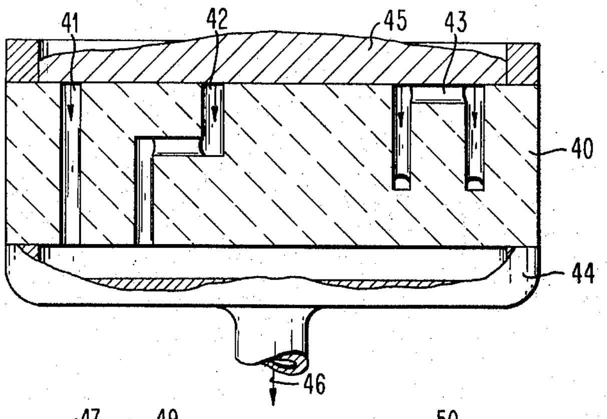
Figure 4:
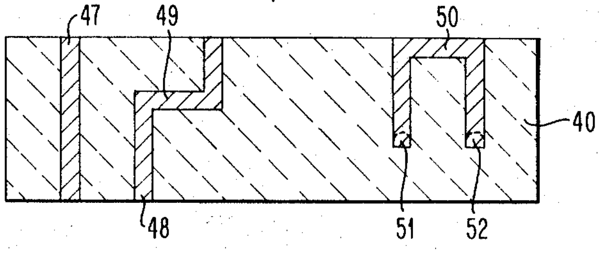
FIG. 4 is a sectional view of a completed multi-level circuit package.

The formed module such as shown in FIG. 3C is ready for metallization. It is to be emphasized that metallization occurs only after the ceramic structure has been rendered dense. Metallization may be accomplished by either a solution metallizing capillary fill process or by a die-casting method. In the latter method, the module 40 is placed in a vacuum chuck 44 and a globule 45 of a conductive material such as copper is positioned on the top of the module. A vacuum is applied at 46 and the conductive material is drawn into the passages 41, 42, 43. While the metallization process is taking place, the module is heated to the melting point of the conductive material, such as 1,200° C for copper, and the entire arrangement is located in forming gas. The completed multilayer circuit module is shown at 40 in FIG. 4 with the conductive via holes 47, 48 having a conductive line portion 49, and the conductive pattern 50 with connections at 51, 52 to another plane of the module.

The process of this application permits via holes and channels of much smaller dimensions to be formed than can be formed by mechanically punching holes in "green" sheets. This process is particularly advantageous where the via holes are required to be less than 5 mils in diameter. The lines for power carrying purposes in such modules are usually 6 mils in width, whereas signal lines are 4 mils. Using this method, such lines can be made 1 mil in width. Both the holes and lines are made at the same time eliminating registration problems that occur in other processes for forming them separately. The metallization is performed after the firing of the ceramic material substantially improving the tolerances that are obtained in the conductive holes and lines of the completed module.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. In a method for manufacturing a multilayer ceramic circuit board having conductors disposed in and interconnecting different layers of said board, in which a plurality of "green" sheets of ceramic material dispersed in a heat volatile binder are prepared and predetermined patterns of via holes and channels are formed in predetermined ones of said sheets, the sheets are stacked one upon another in registry such that the channels and holes in different sheets are superposed in a desired circuit pattern, the sheets are laminated and heated at a temperature high enough to drive off said binders and sinter the ceramic to a dense state with continuous paths through the densified ceramic as defined by the via holes and channels of said circuit pattern, and the paths are filled with a molten conductor to complete said circuit pattern, the improvement characterized by comprising the steps of individually positioning each of the "green" sheets in juxtaposed relationship with one of a plurality of masks, each mask having a predetermined pattern of apertures therein, the dimensions of the various portions of the aperture pattern in the mask conforming to the desired via hole and channel personality for the juxtaposed "green" sheet, and individually exposing each of the "green" sheets through the pattern of apertures in the juxtaposed mask to radiation for a given time to form simultaneously the via holes and channels in that "green" sheet, the depth of the formed holes and channels being determined by the dimensions of the apertures of the various portions of the pattern in the juxtaposed mask, said radiation being laser radiation at a constant power level in the range of 0.01 to 0.1 joules per 25 square mils of area exposed to the radiation during the given time of 1 millisecond.

2. In the method of claim 1, wherein the paths are filled with the molten conductor only after the ceramic is sintered to a dense state.

3. In the method of claim 2, wherein filling of said paths occurs by capillary flow of the molten conductor through the via holes and channels.

4. In the method of claim 2, wherein filling of said paths occurs by applying a vacuum to said ceramic board to draw the molten conductor through the via holes and channels.

5. A method for manufacturing a multilayer ceramic circuit board having conductors disposed in and interconnecting different layers, said method comprising the steps of:

preparing a plurality of "green" ceramic sheets of ceramic material dispersed in a heat volatile binder, individually positioning each of the "green" sheets in juxtaposed relationship with one of a plurality of masks, each mask having a predetermined pattern of apertures therein, the dimensions of the various portions of the aperture pattern in the mask conforming to the desired via hole and channel personality for the juxtaposed "green" sheet, and individually exposing each of the "green" sheets through the pattern of apertures in the juxtaposed mask to laser radiation of constant power level in the range of 0.01 to 0.1 joules per 25 square mils of area exposed to the radiation for a given time of 1 millisecond to form simultaneously the via holes and channels in that "green" sheet, the depth of the formed holes and channels being determined by the dimensions of the apertures of the various portions of the pattern in the juxtaposed mask, stacking said sheets one upon another in registry such that patterns on and holes in different sheets are superposed in a desired circuit pattern, laminating said sheets, heating said laminated sheets at a temperature high enough to drive off said binders and sinter said ceramic to a dense state with continuous paths through the densified ceramic as defined by the locations for the via holes and channels of said circuit pattern, and filling said paths with a molten conductor to complete said circuit pattern.

* * * * *